(12) United States Patent
Sano

(10) Patent No.: US 12,471,433 B2
(45) Date of Patent: Nov. 11, 2025

(54) FLEXIBLE SUBSTRATE

(71) Applicant: Magnolia White Corporation, Tokyo (JP)

(72) Inventor: Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 550 days.

(21) Appl. No.: 17/705,388

(22) Filed: Mar. 28, 2022

(65) Prior Publication Data

US 2022/0310950 A1    Sep. 29, 2022

(30) Foreign Application Priority Data

Mar. 29, 2021   (JP) ................................. 2021-055549

(51) Int. Cl.
| | | |
|---|---|---|
| *H10K 39/30* | (2023.01) | |
| *H10K 30/82* | (2023.01) | |
| *H10K 77/10* | (2023.01) | |
| *H10K 102/10* | (2023.01) | |

(52) U.S. Cl.
CPC ............ *H10K 39/30* (2023.02); *H10K 30/82* (2023.02); *H10K 77/111* (2023.02); *H10K 2102/103* (2023.02)

(58) Field of Classification Search
CPC ...... H10K 30/82; H10K 39/30; H10K 77/111; H10K 2102/103
See application file for complete search history.

(56) References Cited

U.S. PATENT DOCUMENTS

| | | | | |
|---|---|---|---|---|
| 5,872,355 A | * | 2/1999 | Hueschen | ............ H04N 1/0317 |
| | | | | 315/169.3 |
| 6,743,982 B2 | * | 6/2004 | Biegelsen | ........... H01L 25/0655 |
| | | | | 257/E23.177 |
| 9,936,574 B2 | * | 4/2018 | Rogers | .................. A61B 5/6867 |
| 11,164,917 B1 | * | 11/2021 | Wang | ........................ G09G 3/03 |
| 2006/0169989 A1 | * | 8/2006 | Bhattacharya | ....... H10K 77/111 |
| | | | | 428/917 |
| 2010/0224950 A1 | * | 9/2010 | Dinyari | ..................... B81B 7/04 |
| | | | | 438/689 |
| 2012/0103669 A1 | * | 5/2012 | Pruneri | ................ H10K 50/805 |
| | | | | 174/250 |
| 2014/0022746 A1 | * | 1/2014 | Hsu | ...................... H05K 1/0271 |
| | | | | 174/254 |

(Continued)

FOREIGN PATENT DOCUMENTS

| | | |
|---|---|---|
| JP | 2015-198101 A | 11/2015 |
| JP | 2015-198102 A | 11/2015 |

(Continued)

*Primary Examiner* — William B Partridge
*Assistant Examiner* — Linda J. Fleck
(74) *Attorney, Agent, or Firm* — XSENSUS LLP

(57) ABSTRACT

According to one embodiment, a flexible substrate including an insulating base including an island-shaped portion, a first to fourth strip portion, and an electrical element, wherein the electrical element includes a lower electrode, an upper electrode and an active layer, the lower electrode includes, in plan view, a first to fourth protruding portion, the first protruding portion overlaps the first strip portion, the second protruding portion overlaps the second strip portion, the third protruding portion overlaps the third strip portion, and the fourth protruding portion overlaps the fourth strip portion.

7 Claims, 7 Drawing Sheets

(56) References Cited

U.S. PATENT DOCUMENTS

| | | | | |
|---|---|---|---|---|
| 2014/0220422 A1* | 8/2014 | Rogers | ................... | H01L 23/18 |
| | | | | 438/117 |
| 2014/0291649 A1* | 10/2014 | Takahashi | ........ | H10K 59/80522 |
| | | | | 438/34 |
| 2014/0340857 A1* | 11/2014 | Hsu | ..................... | H01L 23/5386 |
| | | | | 174/254 |
| 2015/0282294 A1 | 10/2015 | Wakuda et al. | | |
| 2015/0282296 A1 | 10/2015 | Ogura et al. | | |
| 2016/0155788 A1* | 6/2016 | Kwon | .................. | H10K 59/131 |
| | | | | 257/40 |
| 2017/0003440 A1* | 1/2017 | Kim | .................... | H05K 1/0283 |
| 2017/0040395 A1* | 2/2017 | Jeong | .................. | H10K 59/131 |
| 2017/0181276 A1 | 6/2017 | Sawada et al. | | |
| 2018/0114825 A1* | 4/2018 | Hong | .................. | H10K 59/121 |
| 2020/0267835 A1* | 8/2020 | Okimoto | ................ | H05K 1/118 |
| 2021/0026411 A1* | 1/2021 | Ke | .......................... | G06F 1/189 |
| 2021/0064167 A1* | 3/2021 | Hsu | ........................ | G06F 1/182 |
| 2022/0320252 A1* | 10/2022 | Sano | .................... | H10K 59/131 |
| 2023/0012698 A1* | 1/2023 | Mochizuki | ............. | H10K 39/32 |
| 2023/0345747 A1* | 10/2023 | Sano | .................... | H10K 77/111 |

FOREIGN PATENT DOCUMENTS

| | | |
|---|---|---|
| JP | 2017-113088 A | 6/2017 |
| JP | 2017-118109 A | 6/2017 |

\* cited by examiner

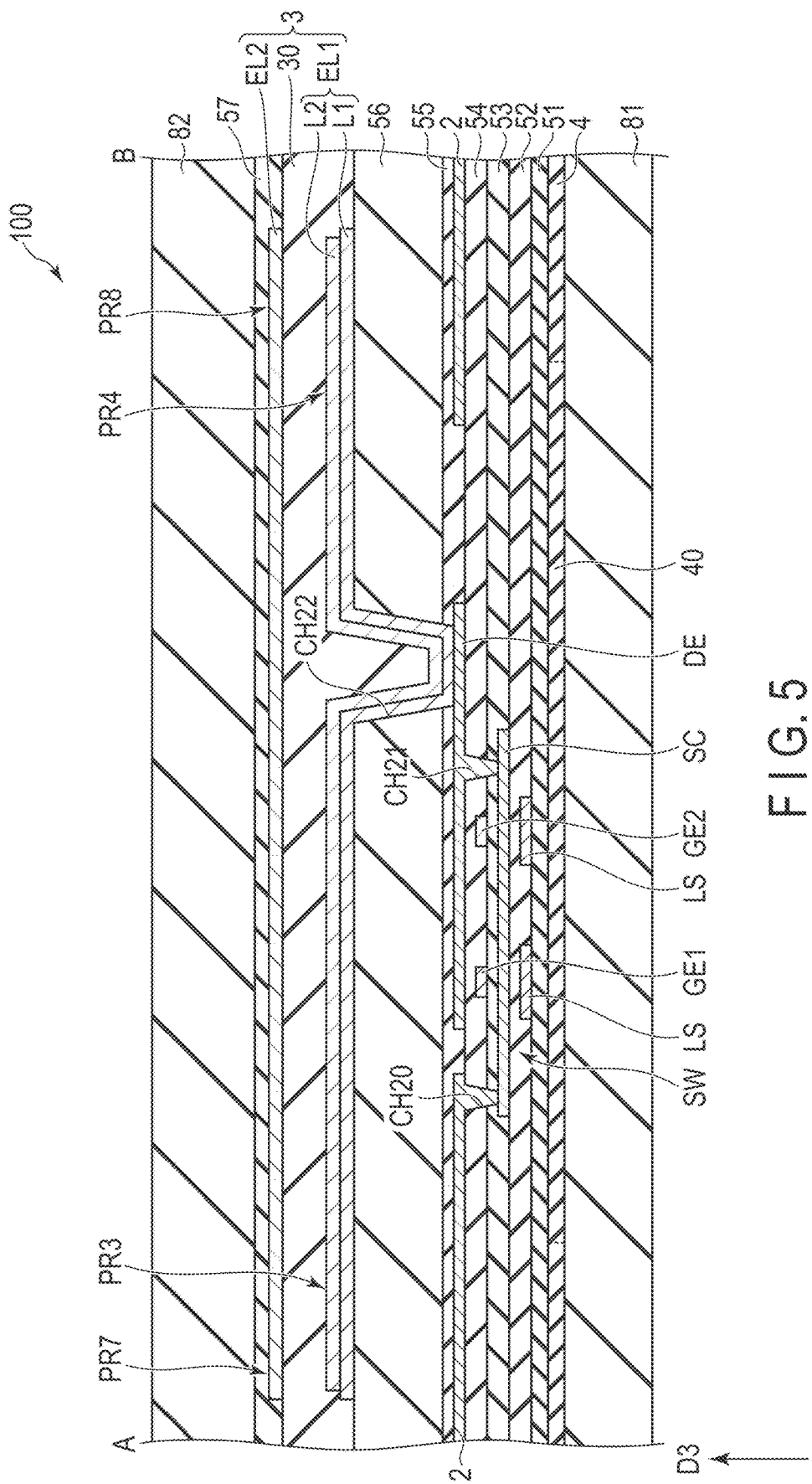
F I G. 5

FLEXIBLE SUBSTRATE

CROSS-REFERENCE TO RELATED APPLICATIONS

This application is based upon and claims the benefit of priority from Japanese Patent Application No. 2021-055549, filed Mar. 29, 2021, the entire contents of which are incorporated herein by reference.

FIELD

Embodiments described herein relate generally to a flexible substrate.

BACKGROUND

In recent years, the use of flexible substrates having flexibility and elasticity has been studied in various fields. As an example of such use, a flexible substrate on which electrical elements arranged in a matrix shape can be attached to a curved surface such as a housing of an electronic device or a human body. As the electrical elements, for example, various sensors such as touch sensors and temperature sensors, and display elements can be applied.

In the flexible substrates, it is necessary to take measures to prevent the wiring portions from being damaged by stress caused by bending and stretching. As such measures, for example, it has been proposed that honeycomb-shaped openings be provided in the substrate which supports the wiring portion, and that the wiring portion are formed into a meandering shape.

BRIEF DESCRIPTION OF THE DRAWINGS

FIG. 5 is a cross-sectional view of the flexible substrate taken along line A-B shown in FIG. 3.

DETAILED DESCRIPTION

Figure 1:
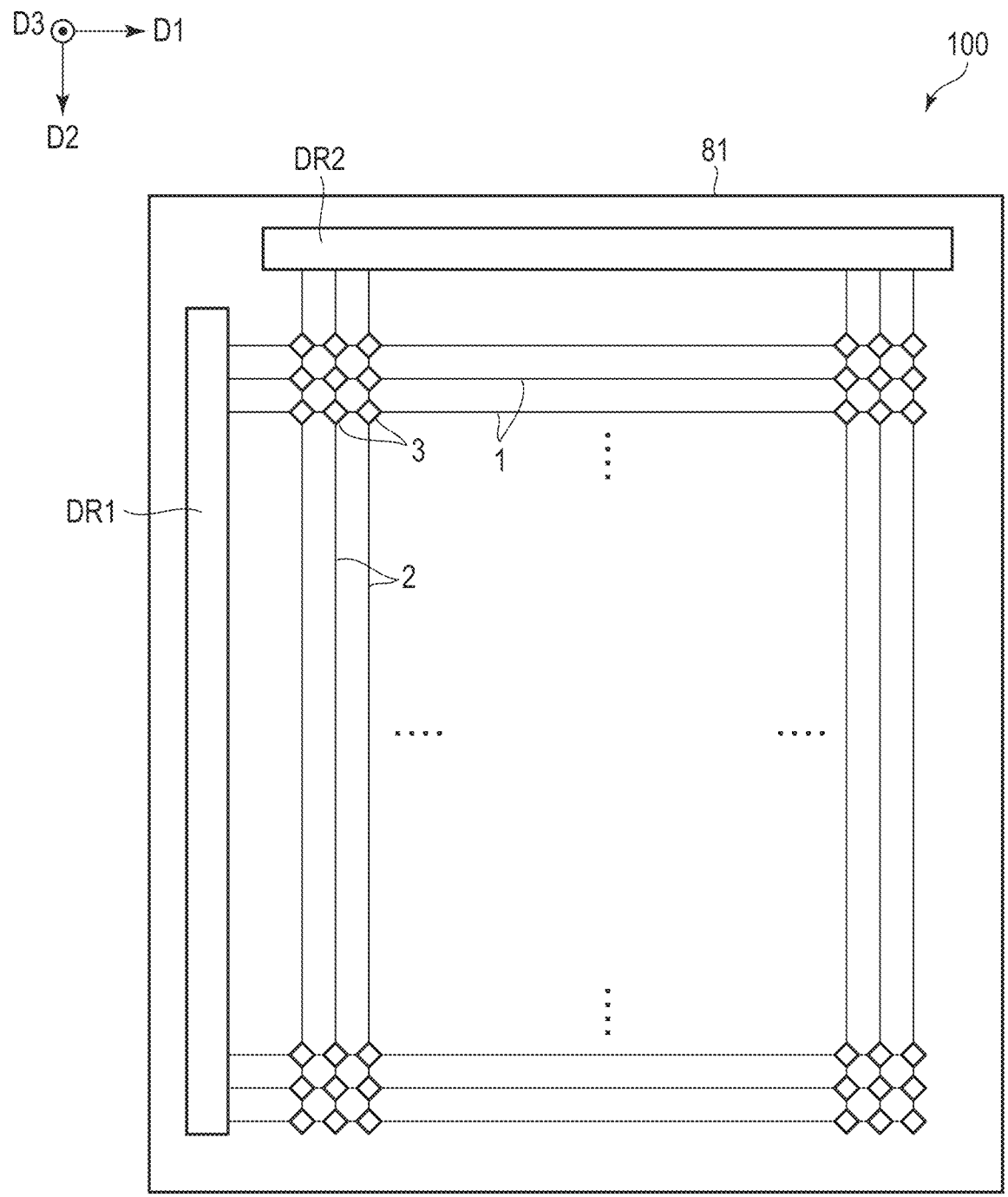
FIG. 1 is a plan view schematically showing a flexible substrate according to this embodiment.

In general, according to one embodiment, a flexible substrate comprising an insulating base including an island-shaped portion, a first strip portion extending from the island-shaped portion in a first direction, a second strip portion extending from the island-shaped portion to a side opposite to the first strip portion, a third strip portion extending from the island-shaped portion in a second direction intersecting the first direction, and a fourth strip portion extending from the island-shaped portion to a side opposite to the third strip portion, and an electrical element overlapping the island-shaped portion, wherein the electrical element comprises a lower electrode, an upper electrode located above the lower electrode and an active layer located between the lower electrode and the upper electrode, the lower electrode comprises, in plan view, a first protruding portion protruding in the first direction, a second protruding portion protruding to a side opposite to the first protruding portion, a third protruding portion protruding in the second direction, and a fourth protruding portion protruding to a side opposite to the third protruding portion, the first protruding portion overlaps the first strip portion, the second protruding portion overlaps the second strip portion, the third protruding portion overlaps the third strip portion, and the fourth protruding portion overlaps the fourth strip portion.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

FIG. 1 is a perspective view schematically showing a configuration of a flexible substrate 100 of the present embodiment.

In this embodiment, a first direction D1, a second direction D2 and a third direction D3 are defined as shown in the figure. The first direction D1 and the second direction D2 are parallel to the main surface of the flexible substrate 100 and intersect each other. The third direction D3 is perpendicular to the first direction D1 and the second direction D2, and corresponds to the thickness direction of the flexible substrate 100. In this embodiment, the first direction D1 and the second direction D2 intersect at right angles, but they may intersect at an angle other than right angles. In this document, the direction toward the tip of the arrow indicating the third direction D3 is referred to as "up" and the direction from the tip of the arrow to the opposite direction is referred to as "down". Further, when it is assumed that there is an observation position to observe the flexible substrate 100 on a side of the tip of the arrow indicating the third direction D3, viewing from this observation position toward a D1-D2 plane defined by the first direction D1 and the second direction D2 is referred to as a planar view.

As shown in FIG. 1, the flexible substrate 100 comprises a plurality of scanning lines 1, a plurality of signal lines 2, a plurality of electrical elements 3, a resin layer 81, a scanning line driver DR1, a signal line driver DR2. The scanning lines 1, the signal lines 2, the electrical elements 3, the scanning line driver DR1 and the signal line driver DR2 are provided on the resin layer 81.

The scanning lines 1 each extend along the first direction D1 and are aligned along the second direction D2. The scanning lines 1 are connected to the scanning line driver DR1. The signal lines 2 each extend along the second direction D2 and are aligned along the first direction D1. The signal lines 2 are connected to the signal line driver DR2. The electrical elements 3 are located respectively at intersections of the scanning lines 1 and the signal lines 2, respectively, and are electrically connected to the respective scanning line 1 and the respective signal line 2.

A scanning signal is supplied to the electrical element 3 via the respective scanning line 1. When the electric element 3 is, for example, of a type such as a sensor, which outputs signals, the signal line 2 receives the output signal from the electric element 3. Note that the scanning lines 1 and the signal lines 2 are an example of the wiring lines of the flexible substrate 100. In addition to the scanning lines 1 and the signal lines 2, the flexible substrate 100 may comprise other types of wiring lines including a power supply line that supplies power to the electric elements 3.

The scanning line driver DR1 functions as a supply source that supplies scanning signals to each of the scanning lines 1. The signal line driver DR2 functions as a supply source that supplies drive signals to each of the signal lines 2, or as a signal processing unit that processes the output signals output to each of the signal lines 2.

Figure 2:
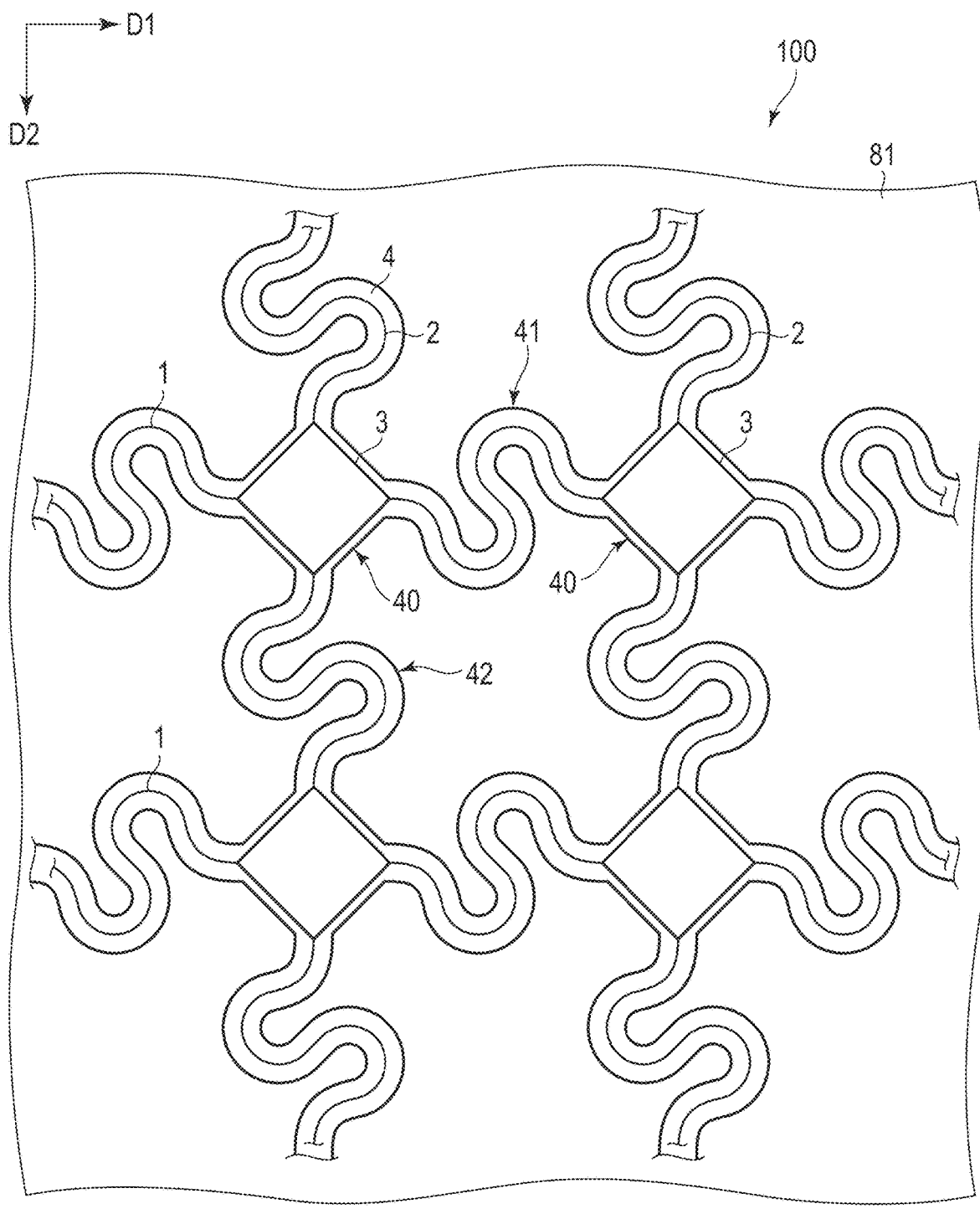
FIG. 2 is a partially enlarged plan view of the flexible substrate shown in FIG. 1.

FIG. 2 shows a partially enlarged plan view of the flexible substrate 100 shown in FIG. 1.

As shown in FIG. 2, the flexible substrate 100 comprises, in addition to those mentioned above, an insulating base 4 that supports the scanning lines 1 and signal lines 2. The insulating base 4 has elasticity and flexibility. The insulating base 4 is formed of, for example, polyimide, but the material is not limited to this.

The insulating base 4 comprises a plurality of island-shaped portions 40 and strip portions 41 and 42 formed to be integrated with each island-shaped portion 40. The insulating base 4 is formed into a mesh fashion. The island-shaped portions 40 are arranged in a matrix along the first direction D1 and the second direction D2 so as to be spaced from each other. Each of the island-shaped portions 40 is formed into, for example, a rectangular shape in plan view. The island-shaped portions 40 may be formed in other polygonal shapes or circular or elliptical shapes. The electrical elements 3 are superimposed respectively on the island-shaped portions 40.

The strip portions 41 each extend substantially along the first direction D1 and are aligned along the second direction D2. The strip portions 41 connect those island-shaped portions 40 which are aligned along the first direction D1, to each other. The strip portions 42 extends substantially along the second direction D2 and are aligned along the first direction D1. The strip portions 42 connect those island-shaped portions 40 which are aligned along the second direction D2, to each other. The strip portions 41 and 42 are each formed in a wavy shape in plan view. In other words, the strip portions 41 and 42 are formed in a meandering shape in plan view.

The scanning lines 1 extend while overlapping the strip portions 41, respectively. The signal lines 2 extend while overlapping the strip portions 42, respectively. That is, the scanning lines 1 and the signal lines 2 are all formed into a meandering shape.

Figure 3:
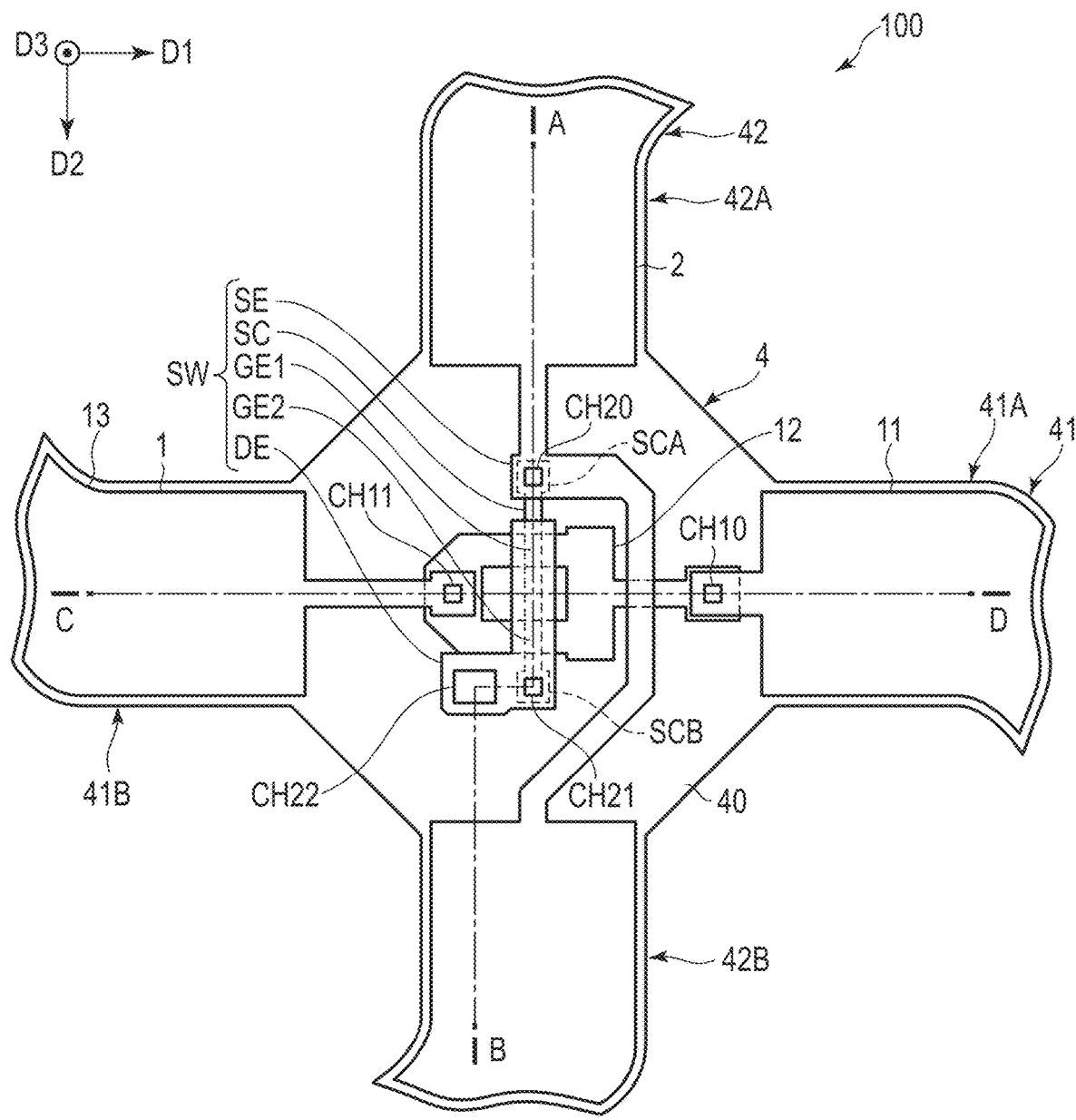
FIG. 3 is an enlarged plan view of an island-shaped portion shown in FIG. 2.

FIG. 3 is an enlarged plan view of an island-shaped portion 40 shown in FIG. 2. In FIG. 3, the electrical element 3 is omitted from the illustration. The insulating base 4 includes a first strip portions 41A extending in the first direction D1 from the island-shaped portion 40, a second strip portion 41B extending to a side opposite to the first strip portion 41A from the island-shaped portion 40, a third strip portion 42A extending in the second direction D2 from the island-shaped portion 40 and a fourth strip portion 42B extending to a side opposite to the third strip portion 42A from the island-shaped portion 40. The first and second strip portions 41A and 41B are included in the strip portion 41. The third and fourth strip portions 42A and 42B are included in the strip portions 42.

The scanning lines 1 each include a first portion 11, a second portion 12, and a third portion 13. The first portion 11 overlaps the first strip portion 41A. The third portion 13 overlaps the second strip portion 41B. The first portion 11 and the third portion 13 are formed in the same layer as the respective signal line 2. The second portion 12 is located between the first portion 11 and the third portion 13. The second portion 12 is formed in a different layer from that of the signal line 2 and intersects the signal line 2. The first portion 11 and the second portion 12 are connected to each other via a contact hole CH10, and the second portion 12 and the third portion 13 are connected to each other via a contact hole CH11.

The flexible substrate 100 comprises switching elements SW. The switching elements SW each include a semiconductor layer SC, gate electrodes GE1 and GE2, a source electrode SE, and a drain electrode DE. The semiconductor layer SC extends in the second direction D2. One end portion SCA of the semiconductor layer SC overlaps the signal line 2, and the other end portion SCB of the semiconductor layer SC overlaps the drain electrode DE. The region of the signal line 2, which overlaps the semiconductor layer SC, functions as the source electrode SE. The semiconductor layer SC intersects with the second portion 11 of the scanning line 1 at two locations in the position where it overlaps the drain electrode DE. The regions of the scanning line 1, which overlap the semiconductor layer SC, function as the gate electrodes GE1 and GE2, respectively. That is, the switching elements SW in the example shown in the figure have a double-gate structure. The semiconductor layer SC is connected to the signal line 2 in the one end portion SCA via a contact hole CH20, and is electrically connected to the drain electrode DE via a contact hole CH21 in the other end portion SCB. The drain electrode DE is connected to the lower electrode EL1, which will be described later, via a contact hole CH22.

Figure 4:
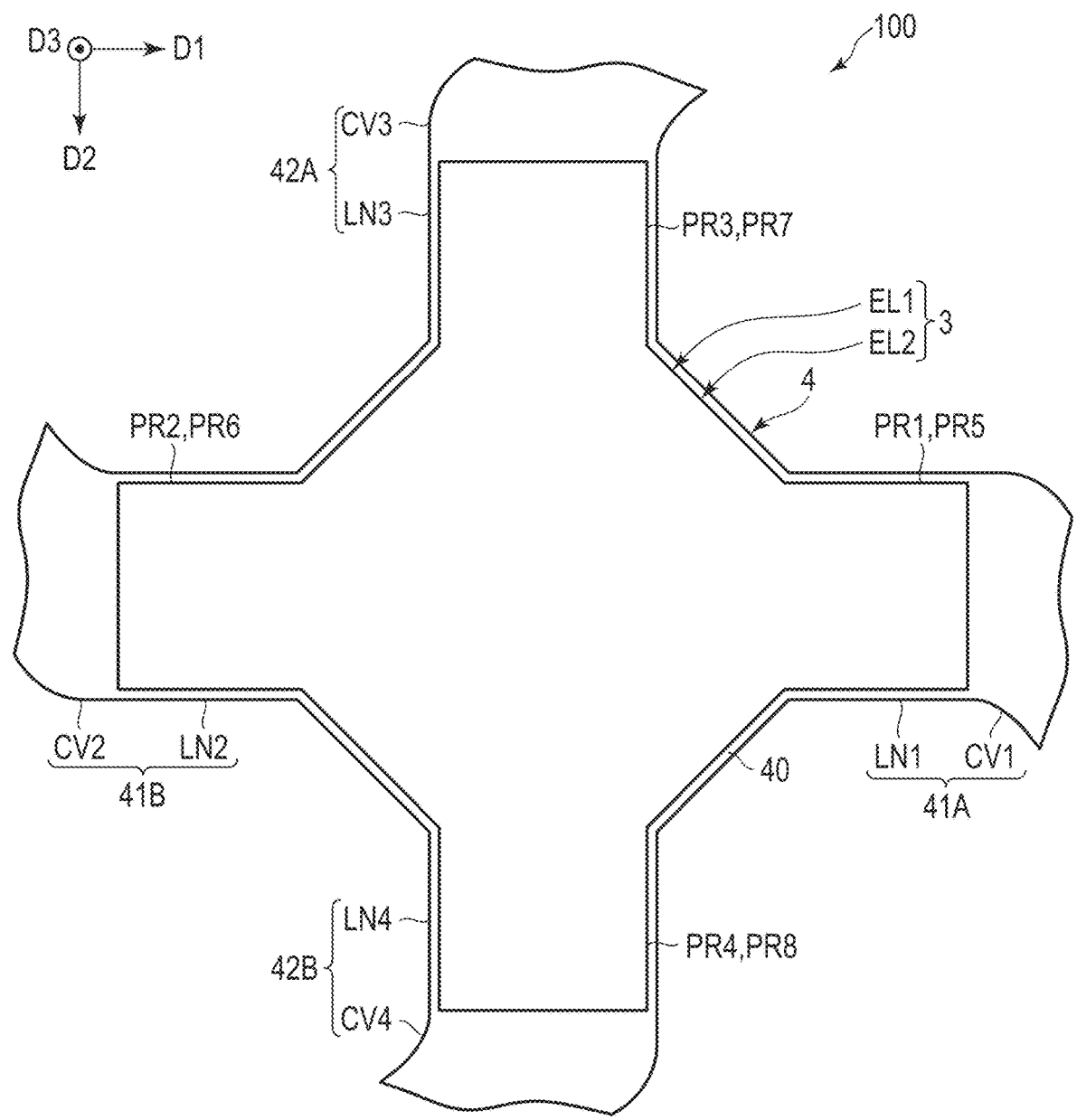
FIG. 4 is a plan view of an electrical element omitted from the illustration in FIG. 3.

FIG. 4 is a plan view of an electrical element 3, which is omitted from the illustration in FIG. 3.

The electrical element 3 includes a lower electrode EL1, an upper electrode EL2 located above the lower electrode EL1, and an active layer 30, which will be described later. The lower electrode EL1 and the upper electrode EL2 are formed identical in shape.

The lower electrode EL1 is formed in a crisscross pattern on the respective island-shaped portion 40. The lower electrode EL1 comprises, in plan view, a first protruding portion PR1 that protrudes in the first direction D1, a second protruding portion PR2 which protrudes to a side opposite to the first protruding portion PR1, a third protruding portion PR3 that protrudes in the second direction D2, and a fourth protruding portion PR4 that protrudes to a side opposite to the third protruding portion PR3. The first protruding portion PR1 overlaps the first strip portion 41A. The second protruding portion PR2 overlaps the second strip portion 41B. The third protruding portion PR3 overlaps the third strip portion 42A. The fourth protruding portion PR4 overlaps the fourth strip portion 42B.

The upper electrode EL2 is formed in a crisscross pattern on the island-shaped portion 40. The upper electrode EL2 comprises a fifth protruding portion PR5 that protrudes in the first direction D1 in plan view, a sixth protruding portion PR6 that protrudes to a side opposite to the fifth protruding portion PR5, a seventh protruding portion PR7 that protrudes in the second direction D2 and an eighth protruding portion PR8 that protrudes to a side opposite to the seventh protruding portion PR7. The fifth protruding portion PR5 overlaps the first protruding portion PR1. The sixth protruding portion PR6 overlaps second protruding portion PR2. The seventh protruding portion PR7 overlaps the third protruding portion PR3. The eighth protruding portion PR8 overlaps the fourth protruding portion PR4.

The first strip portions 41A of the insulating base 4 comprises a first linear portion LN1, which is linearly formed and connected to the island-shaped portion 40 and a first curved portion CV1, which is curvedly formed and connected to the first linear portion LN1. The second strip portion 41B comprises a second linear portion LN2, which is linearly formed and connected to the island-shaped portion 40, and a second curved portion CV2, which is curvedly formed and connected to the second linear portion LN2. The third strip portion 42A comprises a third linear portion LN3, which is linearly formed and connected to the island-shaped portion 40 and a third curved portion CV2, which is curvedly formed and connected to the third linear portion LN3. The fourth strip portion 42B comprises a fourth linear portion LN4, which is linearly formed and connected to the island-shaped portion 40 and a fourth curve portion CV4, which is curvedly formed and connected to the fourth linear portion LN4.

The first protruding portion PR1 overlaps the first linear portion LN1 and does not overlap the first curved portion CV1. The second protruding portion PR2 overlaps the second linear portion LN2 and does not overlap with the second curved portion CV2. The third protruding portion PR3 overlaps the third linear portion LN3 and does not overlap the third curved portion CV3. The fourth protruding portion PR4 overlaps the fourth linear portion LN4 and does not overlap the fourth curved portion CV4.

The fifth protruding portion PR5 overlaps the first linear portion LN1 and does not overlap the first curved portion CV1. The sixth protruding portion PR6 overlaps the second linear portion LN2 and does not overlap the second curved portion CV2. The seventh protruding portion PR7 overlaps the third linear portion LN3 and does not overlap the third curved portion CV3. The eighth protruding portion PR8 overlaps the fourth linear portion LN4 and does not overlap the fourth curved portion CV4.

FIG. 5 is a cross-sectional view of the flexible substrate 100 taken along line A-B shown in FIG. 3.

As shown in FIG. 5, the flexible substrate 100 further comprises insulating layers 51 to 56, a sealing layer 57, light-shielding layers LS and a resin layer 82.

The insulating base 4 is located on the resin layer 81. The insulating layer 51 is located on the insulating base 4. The light-shielding layers LS are located on the insulating layer 51. The light-shielding layers LS overlaps the gate electrodes GE1 and GE2, respectively. With this configuration, the light-shielding layers LS can shield the light from a lower side toward the gate electrodes GE1 and GE2. The light-shielding layer LS is made of, for example, a metal material such as aluminum (Al), titanium (Ti), silver (Ag), molybdenum (Mo), tungsten (W), copper (Cu) or chromium (Cr).

The insulating layer 52 is located on the insulating layer 51 to cover the light-shielding layer LS. The semiconductor layer SC is located on the insulating layer 52. The semiconductor layer SC is formed, for example, of a polycrystalline silicon (for example, a low-temperature polysilicon), but may as well be formed of an amorphous silicon or oxide semiconductor. The insulating layer 53 is located on the insulating layer 52 to cover the semiconductor layer SC. The gate electrodes GE1 and GE2 are located on the insulating layer 53. The insulating layer 54 is located on the insulating layer 53 to cover the gate electrodes GE1 and GE2.

The signal lines 2 and the drain electrode DE are located on the insulating layer 54. The signal lines 2 are connected to the semiconductor layer SC via the contact hole CH20 formed in the insulating layers 53 and 54. The signal lines 2 can be formed, for example, of a metal material or a transparent conductive material, and may be of a single-layer or stacked-layered structure. The drain electrode DE is connected to the semiconductor layer SC via the contact hole CH21 formed in the insulating layers 53 and 54. The drain electrode DE is formed, for example, of the same material as that of the signal lines 2. The drain electrode DE covers the gate electrodes GE1 and GE2. With this configuration, the drain electrode DE can shield the light from an upper side towards the gate electrodes GE1 and GE2. The insulating layer 55 is located on the insulating layer 54 to cover the signal lines 2 and the drain electrode DE. The insulating layer 56 is located on the insulating layer 55.

The switching element SW is located between the island-shaped portion 40 of the insulating base 4 and the lower electrode EL1. The switching element SW illustrated here is of a double-gate structure, but it may as well be of a single-gate structure. Further, the switching element SW is of a top gate structure in which the gate electrodes GE1 and GE2 are disposed above the semiconductor layer SC, but may as well be of a single gate structure in which the gate electrodes GE1 and GE2 are disposed below the semiconductor layer SC.

The insulating layers 51 to 55 are all inorganic insulating layers formed of an inorganic insulating material such as silicon oxide (SiO), silicon nitride (SiN), silicon oxynitride (SiON) or the like. The insulating layer 56 is an organic insulating layer formed of an organic insulating material such as acrylic resin. The upper surface of the insulating layer 56 is substantially planarized.

The electrical element 3 is located on the insulating layer 56. The electrical element 3 is, for example, an organic photodetector (organic photo diode (OPD)). As described above, the electric element 3 comprises a lower electrode EL1, an active layer 30 and an upper electrode EL2.

The lower electrode EL1 is located on the insulating layer 56. The lower electrode EL1 comprises a first layer L1 and a second layer L2 stacked one on another. The first layer L1 is connected to the drain electrode DE via the contact hole CH22 formed in the insulating layers 55 and 56. That is, the first layer L1 is in contact with the switching element SW. The first layer L1 and the second layer L2 are transparent electrodes formed of a transparent conductive material such as indium tin oxide (ITO) or indium zinc oxide (IZO). The third protruding portion PR3 of the lower electrode EL1 overlaps the signal lines 2 along the third direction. The fourth protruding portion PR4 of the lower electrode EL1 overlaps the signal lines 2 along the third direction D3.

The active layer 30 is located on the lower electrode EL1. The active layer 30 is made from an electron donor (p-type semiconductor) and an electron acceptor (n-type semiconductor), formed of an organic material.

The upper electrode EL2 is located on the active layer 30. In other words, the active layer 30 is located between the lower electrode EL1 and the upper electrode EL2. The upper electrode EL2 is a transparent electrode formed of a transparent conductive material such as ITO or IZO. The upper electrode EL2 is connected to a power supply line (not shown), a common potential, for example, is supplied thereto. The seventh protruding portion PR7 opposes the third protruding portion PR3 via the active layer 30. The eighth protruding portion PR8 opposes the fourth protruding portion PR4 via the active layer 30. Note that, although not shown in the figure, an electron transport layer is formed between the lower electrode EL1 and the active layer 30, and a hole transport layer is formed between the upper electrode EL2 and the active layer 30.

The active layer 30, when it receives light, generates hole and electron pairs. The hole and electron pairs generated by the active layer 30 generate an electric current, and the electric signal corresponding to the intensity of the current is read out via the respective signal line 2.

The sealing layer 57 covers the upper electrode EL2. The sealing layer 57 inhibits moisture from entering the active layer 30 from outside. The resin layer 82 covers the sealing layer 57.

Figure 6:
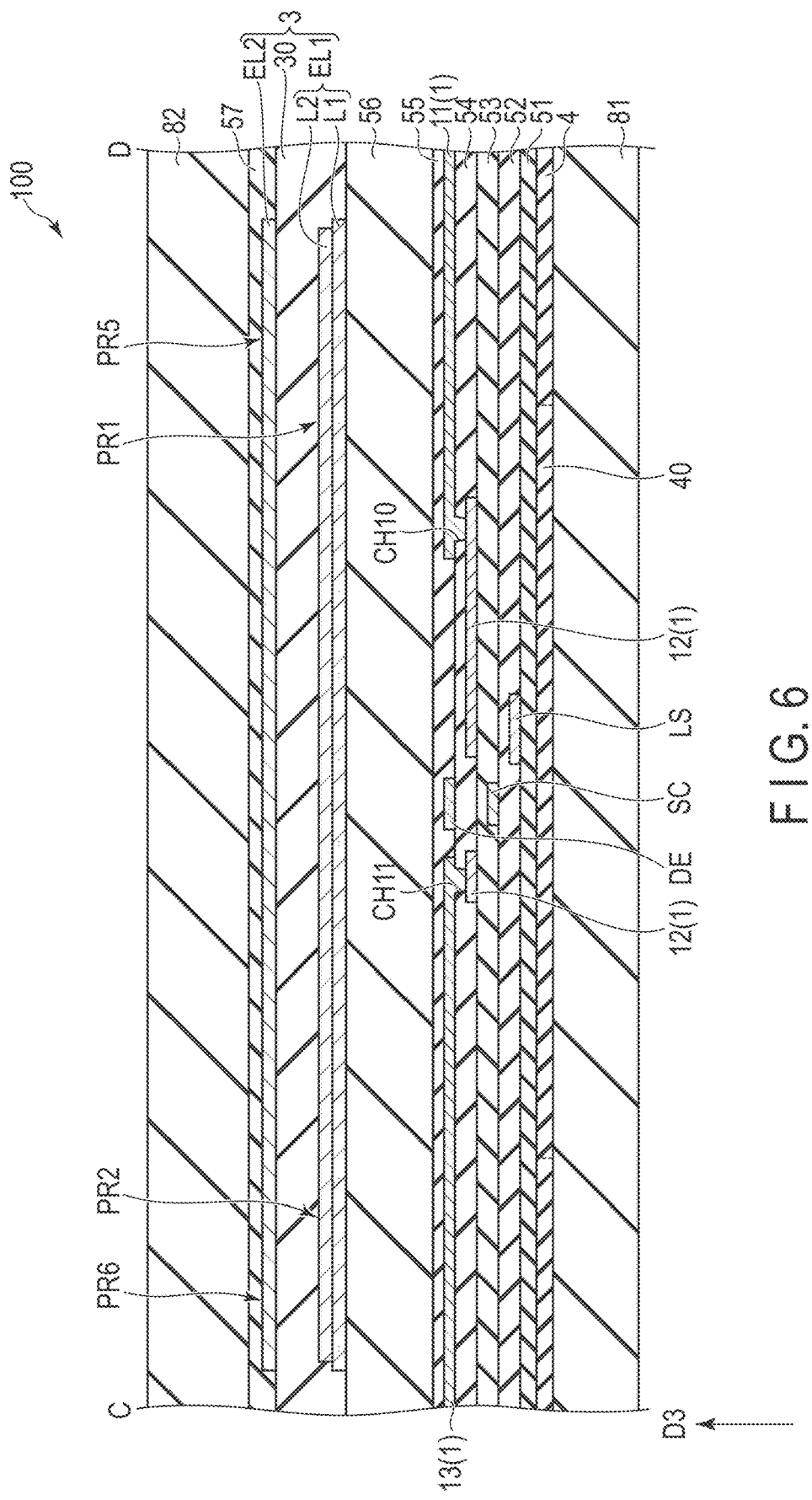
FIG. 6 is a cross-sectional view of the flexible substrate taken along line C-D shown in FIG. 3.

FIG. 6 is a cross-sectional view of the flexible substrate 100 taken along line C-D shown in FIG. 3.

The second portion 12 of the scanning line 1 is located on the insulating layer 53 and is covered by the insulating layer 54. The first portion 11 and the third portion 13 of the scanning line 1, and the drain electrode DE are located above the insulating layer 54 and covered by the insulating layer 55. The first portion 11 is connected to the second portion 12 via the contact hole CH10 formed in the insulating layer 54. The third portion 13 is connected to the second portion 12 through the contact hole CH11 formed in the insulating layer 54. The first portion 11 and the third portion 13 can be formed, for example, of a metal material or a transparent conductive material, and may be of a single-layer or a stacked-layer structure. The second portion 12 is made of any of the metal materials mentioned above or an alloy of any combination of these metal materials, and may be of a single-layer or stacked-layer structure. The fifth protruding portion PR5 opposes the first protruding portion PR1 via the active layer 30. The sixth protruding portion PR6 opposes the second protruding portion PR2 via the active layer 30.

According to this embodiment, the lower electrode EL1 and the upper electrode EL2 are formed into a crisscross pattern. Therefore, as compared to the case where the lower electrode EL1 and the upper electrode EL2 are formed into a rectangular shape which overlaps the island-shaped portion 40, the area where the lower electrode EL1 and the upper electrode EL2 oppose each other can be increased. That is, the capacitance between the lower electrode EL1 and the upper electrode EL2 can be increased. Thus, the sensor sensitivity of the electric element 3 can be improved.

The lower electrode EL1 and the upper electrode EL2 have a rigidity higher than that of the insulating base 4. With the increase in the area of the lower electrode EL1 and the upper electrode EL2, it is possible to improve the rigidity of the flexible substrate 100, and reduce the amount of distortion, which may be caused by elongation.

Figure 7:
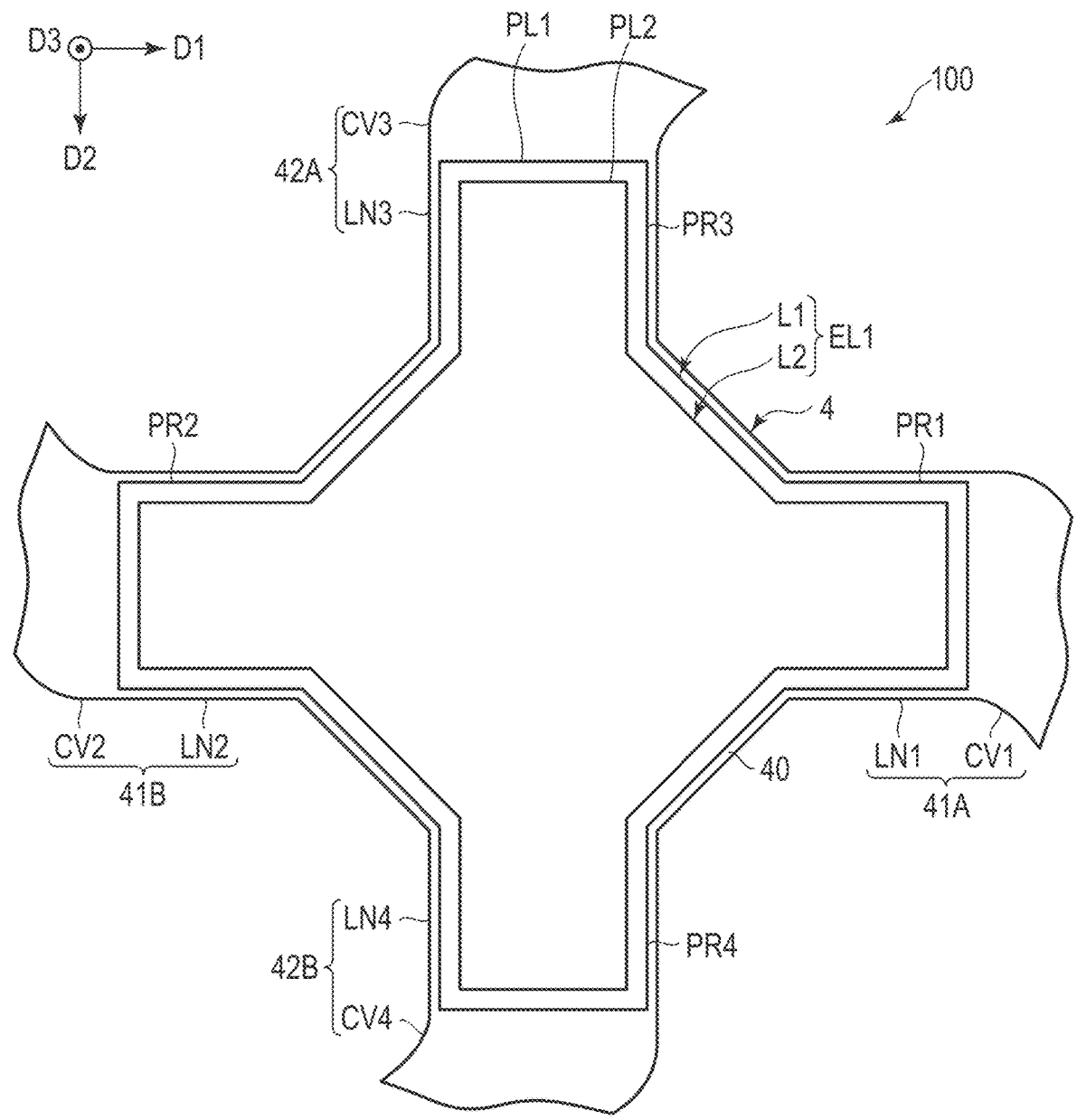
FIG. 7 is a plan view showing a lower electrode.

FIG. 7 is a plan view of the lower electrode EL1. FIG. 7 shows the first layer L1 and the second layer L2 of the lower electrode EL1.

The first layer L1 and the second layer L2 are each formed into a crisscross pattern. That is, the first layer L1 and the second layer L2 are located up to the first protruding portion PR1, the second protruding portion PR2, the third protruding portion PR3, and the fourth protruding portion PR4. The first layer L1 includes an outer peripheral edge PL1. The second layer L2 includes an outer peripheral edge PL2. The outer peripheral edge PL2 is located on an inner side of the outer peripheral edge PL1.

As explained above, according to this embodiment, it is possible to obtain a flexible substrate which can increase the capacitance of the electric element.

Note that this embodiment is described in connection with the case where the electric element 3 is an OPD, but the electric element 3 may be a sensor other than OPD. Further, the upper electrode EL2 may not be of a cross shape, or may be placed on the entire surface of the flexible substrate 100. In that case, as the material of the upper electrode EL2, not ITO or IZO, but an electrode material having elasticity can be used. Or, the upper electrode EL2 may be formed into a pattern similar to that of the insulating base 4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
    an insulating base including:
        an island-shaped portion,
        a first strip portion extending from the island-shaped portion in a first direction,
        a second strip portion extending from the island-shaped portion from a side opposite to the first strip portion,
        a third strip portion extending from the island-shaped portion in a second direction intersecting the first direction, and
        a fourth strip portion extending from the island-shaped portion from a side opposite to the third strip portion; and
    a photodetector overlapping the island-shaped portion, wherein
    the photodetector includes:
        a lower electrode,
        an upper electrode located above the lower electrode, and
        an active layer located between the lower electrode and the upper electrode to generate an electric charge in response to received light for output via the lower electrode,
    the lower electrode includes, in a plan view:
        a first protruding portion protruding from the island-shaped portion in the first direction,
        a second protruding portion protruding from the island-shaped portion from a side opposite to the first protruding portion,
        a third protruding portion protruding from the island-shaped portion in the second direction, and
        a fourth protruding portion protruding from the island-shaped portion from a side opposite to the third protruding portion,
    the first protruding portion overlaps the first strip portion,
    the second protruding portion overlaps the second strip portion,
    the third protruding portion overlaps the third strip portion, and
    the fourth protruding portion overlaps the fourth strip portion.

2. The flexible substrate of claim 1, wherein
    the first strip portion includes a first linear portion connected to the island-shaped portion and a first curved portion connected to the first linear portion,
    the second strip portion includes a second linear portion connected to the island-shaped portion and a second curved portion connected to the second linear portion, the third strip portion includes a third linear portion connected to the island-shaped portion and a third curved portion connected to the third linear portion, the fourth strip portion includes a fourth linear portion connected to the island-shaped portion and a fourth curved portion connected to the fourth linear portion, the first protruding portion of the lower electrode overlaps the first linear portion of the first strip portion, the second protruding portion of the lower electrode overlaps the second linear portion of the second strip portion, the third protruding portion of the lower electrode overlaps the third linear portion of the third strip portion, and the fourth protruding portion of the lower electrode overlaps the fourth linear portion of the fourth strip portion.

3. The flexible substrate of claim 1, wherein the upper electrode includes, in the plan view, a fifth protruding portion protruding in the first direction, a sixth protruding portion protruding from a side opposite to the fifth protruding portion, a seventh protruding portion protruding in the second direction, and an eighth protruding portion protruding from a side opposite to the seventh protruding portion, the fifth protruding portion of the upper electrode overlaps the first protruding portion of the lower electrode, the sixth protruding portion of the upper electrode overlaps the second protruding portion of the lower electrode, the seventh protruding portion of the upper electrode overlaps the third protruding portion of the lower electrode, and the eighth protruding portion of the upper electrode overlaps the fourth protruding portion of the lower electrode.

4. The flexible substrate of claim 1, further comprising:

a switching element located between the island-shaped portion and the lower electrode, wherein the lower electrode comprises a first layer and a second layer stacked one on another, and the first layer is in contact with the switching element.

5. The flexible substrate of claim 4, wherein an outer peripheral edge of the second layer is located on an inner side of an outer peripheral edge of the first layer.

6. The flexible substrate of claim 1, wherein the photodetector is an organic photo diode (OPD).

7. The flexible substrate of claim 1, wherein the active layer of the photodetector is in direct contact with each of the lower electrode and the upper electrode on opposite sides of the active layer.

* * * * *